United States Patent
Chen et al.

(10) Patent No.: US 8,569,888 B2
(45) Date of Patent: Oct. 29, 2013

(54) WIRING STRUCTURE AND METHOD OF FORMING THE STRUCTURE

(75) Inventors: Fen Chen, Williston, VT (US); Jeffrey P. Gambino, Westford, VT (US); Anthony K. Stamper, Williston, VT (US); Timothy D. Sullivan, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 255 days.

(21) Appl. No.: 13/114,079

(22) Filed: May 24, 2011

(65) Prior Publication Data

US 2012/0299188 A1 Nov. 29, 2012

(51) Int. Cl.
*H01L 23/48* (2006.01)
*H01L 21/4763* (2006.01)

(52) U.S. Cl.
USPC .......... 257/751; 257/758; 257/E21.577; 257/E21.584; 257/E23.011; 257/E23.145; 438/624; 438/627; 438/629; 438/654; 438/668

(58) Field of Classification Search
None
See application file for complete search history.

(56) References Cited

U.S. PATENT DOCUMENTS

| | | | |
|---|---|---|---|
| 6,140,237 A | 10/2000 | Chan et al. | |
| 6,211,071 B1 | 4/2001 | Lukanc et al. | |
| 6,258,707 B1 | 7/2001 | Uzoh | |
| 6,261,963 B1 | 7/2001 | Zhao et al. | |
| 6,268,291 B1 | 7/2001 | Andricacos et al. | |
| 6,348,731 B1 | 2/2002 | Ashley et al. | |
| 6,380,075 B1 * | 4/2002 | Cabral et al. | 438/637 |
| 6,429,134 B1 | 8/2002 | Kubota et al. | |
| 6,525,425 B1 | 2/2003 | Woo et al. | |
| 6,633,085 B1 | 10/2003 | Besser et al. | |
| 6,680,540 B2 | 1/2004 | Nakano et al. | |
| 6,746,947 B2 | 6/2004 | Daubenspeck et al. | |
| 6,764,951 B1 | 7/2004 | van Ngo | |
| 6,979,625 B1 | 12/2005 | Woo et al. | |
| 6,984,532 B2 | 1/2006 | Kubota et al. | |
| 7,138,073 B2 | 11/2006 | Minamihaba et al. | |
| 7,157,798 B1 | 1/2007 | Fair et al. | |
| 7,176,119 B2 | 2/2007 | Gambino et al. | |
| 7,291,558 B2 | 11/2007 | Geffken et al. | |
| 7,327,033 B2 | 2/2008 | Edelstein et al. | |
| 2004/0238961 A1 * | 12/2004 | Cunningham | 257/758 |
| 2008/0171433 A1 | 7/2008 | Huang et al. | |
| 2008/0203570 A1 | 8/2008 | Edelstein et al. | |

OTHER PUBLICATIONS

Anderson et al., U.S. Appl. No. 12/628,481, Dec. 1, 2009.

* cited by examiner

*Primary Examiner* — Alonzo Chambliss
(74) *Attorney, Agent, or Firm* — Gibb & Riley, LLC; Richard M. Kotulak, Esq.

(57) ABSTRACT

Disclosed is a wiring structure and method of forming the structure with a conductive diffusion barrier layer having a thick upper portion and thin lower portion. The thicker upper portion is located at the junction between the wiring structure and the adjacent dielectric materials. The thicker upper portion: (1) minimizes metal ion diffusion and, thereby TDDB; (2) allows a wire width to dielectric space width ratio that is optimal for low TDDB to be achieved at the top of the wiring structure; and (3) provides a greater surface area for via landing. The thinner lower portion: (1) allows a different wire width to dielectric space width ratio to be maintained in the rest of the wiring structure in order to balance other competing factors; (2) allows a larger cross-section of wire to reduce current density and, thereby reduce EM; and (3) avoids an increase in wiring structure resistivity.

23 Claims, 9 Drawing Sheets

WIRING STRUCTURE AND METHOD OF FORMING THE STRUCTURE

BACKGROUND

1. Field of the Invention

The disclosed embodiments relate to back end of the line (BEOL) metal wires and, more particularly, to a wiring structure and method of forming the wiring structure with a conductive diffusion barrier layer having a relatively thick upper portion and relatively thin lower portion in order to allow for technology scaling without a significant corresponding increase in electromigration (EM) in the wiring structure, in time-dependent dielectric breakdown (TDDB) between wiring structures and induced by metal ion diffusion, or in wiring structure resistivity.

2. Description of the Related Art

Back end of the line (BEOL) metal wires have different optimal centering points depending upon the fault mechanism at issue. Specifically, the optimal ratio of the width of each wire to the width of a dielectric material in the space between two adjacent wires (i.e., the optimal wire width to dielectric space width ratio) for opens, for electromigration (EM) and for time dependent dielectric breakdown (TDDB) is different from the optimal wire width to dielectric space width ratio for shorts and for parasitic capacitance. Thus, integrated circuits are typically designed with a wire width to dielectric space width ratio that balances these competing factors. However, as operational voltages and wiring densities increase with advances in integrated circuit technologies, EM and TDDB, particularly in the case of copper (Cu) wires in a low-k interlayer dielectric material, have become major concerns. Specifically, increases in operational voltages and decreases in the distance between adjacent copper wires have resulted in increasingly higher electric fields between the adjacent copper wires and increasingly higher current densities inside the copper wires. Over time, high electric fields can result in copper ion (Cu+) diffusion and, thereby poor TDDB. Overtime, high current densities can result in EM degradation. Both TDDB and EM can lead to eventual device failure. It should be noted that EM is of increasing concern with device size scaling. Specifically, from one technology node to the next, the metal wire cross-section is scaled in size by roughly 70%, however, circuit voltage and diffusion barrier thickness are typically not scaled at the same rate. Consequently, the current density imposed on a scaled metal wire is greater and, thus EM is increased.

TDDB can be minimized by lining wiring trenches with a thick diffusion barrier layer. However, when the technology is scaled in size, the thickness of the diffusion barrier layer is also uniformly scaled in size so that the desired wire width to dielectric space width ratio is maintained. Thus, size scaling generally results in a corresponding increase in TDDB. Therefore, there is a need in the art for a wiring structure and a method of forming the structure that allows for technology scaling without a significant corresponding increase in TDDB.

SUMMARY

In view of the foregoing, disclosed herein are embodiments of a back end of the line (BEOL) wiring structure and method of forming the wiring structure with a conductive diffusion barrier layer that has a relatively thick upper portion and relatively thin lower portion. The thicker upper portion of the diffusion barrier layer is located at the junction between the wiring structure and the dielectric materials above and to the side (i.e., at the triple junction). By making the diffusion barrier layer thicker at the triple junction, which is the area most susceptible to failures due to metal ion diffusion induced time dependent dielectric breakdown (TDDB), metal ion diffusion and, thereby TDDB can be minimized. Additionally, the thicker upper portion of the diffusion barrier layer (1) allows a wire width to dielectric space width ratio that is optimal for low TDDB (e.g., 60:40) to be achieved at the top of the wiring structure and (2) provides a greater surface area for via landing. Whereas, the thinner lower portion of the diffusion barrier layer allows a different wire width to dielectric space width ratio (e.g., 50:50) to be maintained in the rest of the wiring structure in order to balance out other competing factors (e.g., EM, shorts and parasitic capacitance). Additionally, the thinner lower portion of the diffusion barrier layer (1) allows a larger cross-section of wire to reduce current density and, thereby reduce EM and (2) avoids an increase in wiring structure resistivity (e.g., due to a reduction in metal volume and/or an increase in the proportional amount of diffusion barrier material in the wiring structure). Thus, the wiring structure allows for technology scaling without a significant corresponding increase in EM in the wiring structure, in TDDB between adjacent wiring structures and induced by metal ion diffusion, or in wiring structure resistivity.

Specifically, embodiments of a wiring structure can comprise at least one dielectric layer. An opening can extend into the dielectric layer(s). This opening can have a lower portion and an upper portion above the lower portion. A conductive diffusion barrier layer can line the opening. A metal layer can be positioned on the diffusion barrier layer so as to fill the opening and an insulating cap layer can be positioned on the top surface of the dielectric layer(s) and can extend laterally over the opening (i.e., over the diffusion barrier layer and the metal layer within the opening).

Additionally, in each of the embodiments of the wiring structure, the diffusion barrier layer can have a first thickness in the lower portion of the opening and a second thickness, which is greater than the first thickness, in the upper portion of the opening. For example, the opening can have a first width and a first depth in the lower portion and a second width, which is greater than the first width, and a second depth, which is shallower than the first depth, in the upper portion. Thus, the upper portion of the opening can have a center section aligned above the lower portion of the opening and edge sections that extend laterally beyond the lower portion of the opening. The diffusion barrier layer can line the lower portion of the opening and can further fill the edge sections of the upper portion. Consequently, the diffusion barrier layer will have the first thickness in the lower portion of the opening and the second thickness, which is greater than the first thickness, in the upper portion of the opening. It should be noted that, depending upon the processing techniques used to form the wiring structure, the lower and upper portions of the opening can be etched into a single dielectric layer or, alternatively, the lower and upper portions of the opening can be etched into two different dielectric layers (i.e., a first dielectric layer and a second dielectric layer comprising a different dielectric material than the first dielectric layer, respectively).

Embodiments of a method of forming such a wiring structure can comprise forming an opening in at least one dielectric layer. Once formed, the opening can be lined with a conductive diffusion barrier layer. Then, a metal layer can be formed on the diffusion barrier layer to fill the opening and an insulating cap layer can be formed on the top surface of the dielectric layer(s) such that it extends laterally over the opening (i.e., over the diffusion barrier layer and the metal layer within the opening).

Additionally, in each of the embodiments of the method, the opening can be lined with the diffusion barrier layer such that the diffusion barrier layer has a first thickness in the lower portion of the opening and a second thickness, which is greater than the first thickness, in the upper portion of the opening.

To accomplish this, the opening can be formed so that it has a lower portion with a first width and a first depth and an upper portion with a second width that is greater than the first width and a second depth that is shallower than the first depth. For example, such an opening can be formed in a single dielectric layer using multiple masked etch processes. Alternatively, such an opening can be formed in multiple dielectric layers (i.e., a first dielectric layer and a second dielectric layer above the first dielectric layer, where the first and second dielectric layers comprise different dielectric materials) by performing a masked etch process to form an initial opening, having the first width and first depth, through the second dielectric layer into the first dielectric layer. Then, a selective isotropic etch process can be used to pull back exposed vertical surfaces of the second dielectric layer such the upper portion of the opening within the second dielectric layer has the second width and second depth and the lower portion of the opening within the first dielectric layer retains the first width. In either case, the upper portion of the opening will have a center section aligned above the lower portion of the opening and edge sections that extend laterally beyond the lower portion of the opening.

Next, multiple sputtering processes can be performed to line the lower portion of the opening and further fill the edge sections of the upper portion of the opening. Performing multiple sputtering processes further ensures that the diffusion barrier layer will have an approximately uniform thickness on the vertical and horizontal surfaces of the lower portion of the opening. Consequently, the diffusion barrier layer will have the first thickness in the lower portion of the opening and the second thickness, which is greater than the first thickness, in the upper portion of the opening.

BRIEF DESCRIPTION OF THE SEVERAL VIEWS OF THE DRAWINGS

The embodiments disclosed herein will be better understood from the following detailed description with reference to the drawings, which are not necessarily drawn to scale and in which.

DETAILED DESCRIPTION

The disclosed embodiments and the various features and advantageous details thereof are explained more fully with reference to the accompanying drawings and the following detailed description.

As mentioned above, back end of the line (BEOL) metal wires have different optimal centering points depending upon the fault mechanism at issue. For example, the optimal ratio of the width of each metal wire to the width of the dielectric material in the space between two adjacent wires (i.e., the optimal wire width to dielectric space width ratio) for opens, for electromigration (EM) and for time dependent dielectric breakdown (TDDB) may be approximately 60:40. Whereas, the optimal wire width to dielectric space width ratio for shorts and for parasitic capacitance may be approximately 40:60. Thus, integrated circuits may be designed with wire width to dielectric space width ratio that balances these competing factors (e.g., a 50:50 wire width to dielectric space width ratio). However, as operational voltages and wiring densities increase with advances in integrated circuit technologies, EM and TDDB, particularly in the case of copper (Cu) wires in a low-k interlayer dielectric material, have become major concerns. Specifically, increases in operational voltages and decreases in the distance between adjacent copper wires have resulted in increasingly higher electric fields between the adjacent copper wires and increasingly higher current densities inside the copper wires. Over time, high electric fields can result in copper ion (Cu+) diffusion and, thereby poor TDDB. Overtime, high current densities can result in EM degradation. Both TDDB and EM can lead to eventual device failure. It should be noted that EM is of increasing concern with device size scaling. Specifically, from one technology node to the next, the metal wire cross-section is scaled in size by roughly 70%, however, circuit voltage and diffusion barrier thickness are typically not scaled at the same rate. Consequently, the current density imposed on a scaled metal wire is greater and, thus EM is increased.

It should be noted that, for the purposes of this disclosure, EM refers to the transport of material caused by the gradual movement of the ions in a wire due to the momentum transfer between conducting electrons and diffusing metal atoms. Furthermore, for purposes of this disclosure, TDDB refers to the formation of a conducting path between adjacent wiring structures (i.e., adjacent metal wires) through an interlayer dielectric (e.g., the dielectric layer 10) due to the movement of metal ions (e.g., metal ions from metal layer 60) particularly through the interlayer dielectrics (e.g., through the dielectric layers 10 and/or 15) and along the interface between the interlayer dielectrics.

Figure 13A:
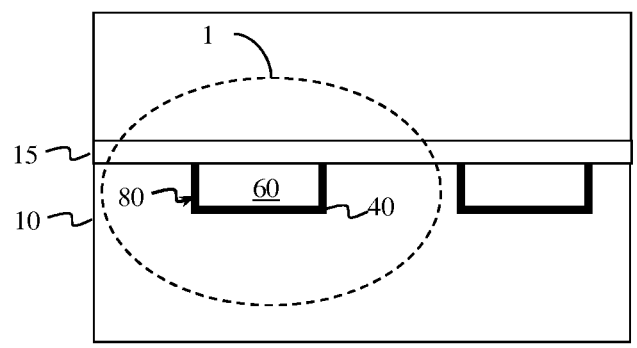
FIGS. 13A-13C are cross-section drawings illustrating problems associated with prior art wiring structures.

TDDB can be minimized by lining wiring trenches with an optimal and balanced diffusion barrier layer. For example, FIG. 13A illustrates a conventional BEOL metal wiring structure 1, in which an opening 80 (e.g., a wiring trench) is formed in a dielectric layer 10. The opening 80 can be lined with a diffusion barrier layer 40 and filled with a metal layer 60. An insulating cap layer 15 can be positioned on the dielectric layer 10 and extending laterally over the opening 80 (i.e., over the diffusion barrier layer 40 and metal layer 60 within the opening) so as to electrically isolate the wiring structure 1. A relatively thick diffusion barrier layer 40 (e.g., 4-5 nm) will reduce the possibility of metal ion diffusion and, thereby keep TDDB relatively low (i.e., slow TDDB). Unfortunately, if the diffusion barrier layer 40 in this wiring structure is relatively thick, EM will be relatively high.

Figure 13B:
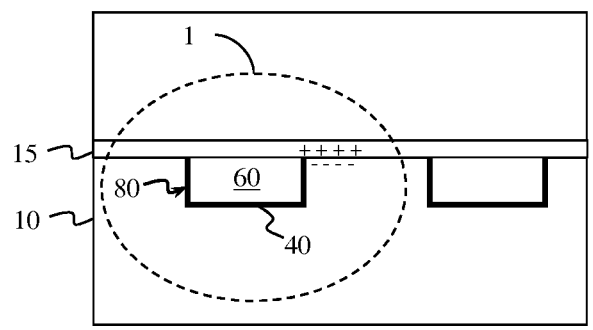

As shown in FIG. 13B, when the technology is scaled in size, the thickness of the diffusion barrier layer 40 can be uniformly scaled in size (e.g., to 1-3 nm) so that the desired wire width to dielectric space width ratio is maintained. Unfortunately, size scaling in this manner generally results in a corresponding increase in TDDB (i.e., fast TDDB) because the diffusion barrier layer 40 is not thick enough to avoid metal ion diffusion.

Figure 13C:
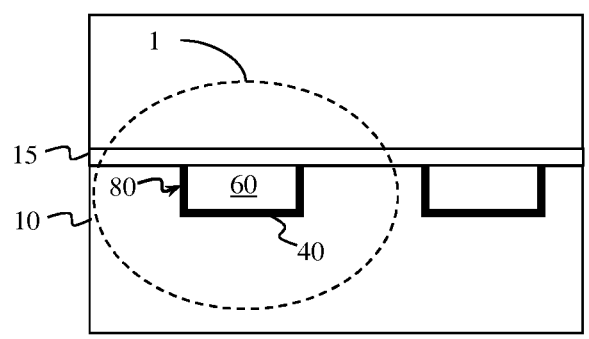

In order to maintain the acceptable TDDB performance, the thickness of diffusion barrier layer needs to be kept the same (e.g., 4-5 nm). However, as shown in FIG. 13C, the trade-off for keeping the thick diffusion barrier layer 40 (e.g., 4-5 nm) during technology size scaling is to change the metal wire width to dielectric space width ratio and/or to reduce the volume of the metal layer 60, which would increase the proportional amount of diffusion barrier material in the wiring structure 1. However, neither of these trade-offs are acceptable because, while keeping the thick diffusion barrier results in relative low TDDB, changing the metal wire width to dielectric space width ratio impacts other failure mechanisms. Furthermore, reducing the volume of the metal layer 60 and increasing the proportional amount of diffusion barrier material in the wiring structure 1 both result in a corresponding increase in the resistivity of the wiring structure 1.

In view of the foregoing, disclosed herein are embodiments of a back end of the line (BEOL) wiring structure and method of forming the wiring structure with a conductive diffusion barrier layer that has a relatively thick upper portion and relatively thin lower portion. The thicker upper portion of the diffusion barrier layer is located at the junction between the wiring structure and the dielectric materials above and to the side (i.e., at the triple junction). By making the diffusion barrier layer thicker at the triple junction, which is the area most susceptible to failures due to metal ion diffusion induced time dependent dielectric breakdown (TDDB), metal ion diffusion and, thereby TDDB can be minimized. Additionally, the thicker upper portion of the diffusion barrier layer (1) allows a wire width to dielectric space width ratio that is optimal for low TDDB (e.g., 60:40) to be achieved at the top of the wiring structure and (2) provides a greater surface area for via landing. Whereas, the thinner lower portion of the diffusion barrier layer allows a different wire width to dielectric space width ratio (e.g., 50:50) to be maintained in the rest of the wiring structure in order to balance out other competing factors (e.g., EM, shorts and parasitic capacitance). Additionally, the thinner lower portion of the diffusion barrier layer (1) allows a larger cross-section of wire to reduce current density and, thereby reduce electromigration (EM) and (2) avoids an increase in wiring structure resistivity (e.g., due to a reduction in metal volume and/or an increase in the proportional amount of diffusion barrier material in the wiring structure). Thus, the wiring structure allows for technology scaling without a significant corresponding increase in EM in the wiring structure, in TDDB between adjacent wiring structures and induced by metal ion diffusion, or in wiring structure resistivity.

Figure 1:
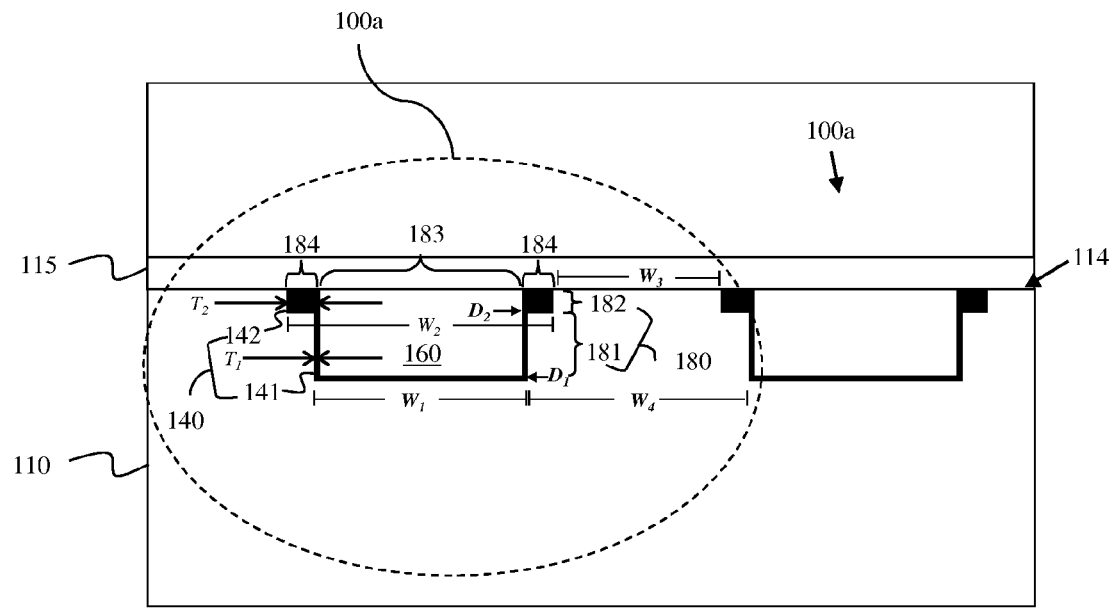
FIG. 1 is a cross-section drawing illustrating one embodiment of a wiring structure.
Figure 2:
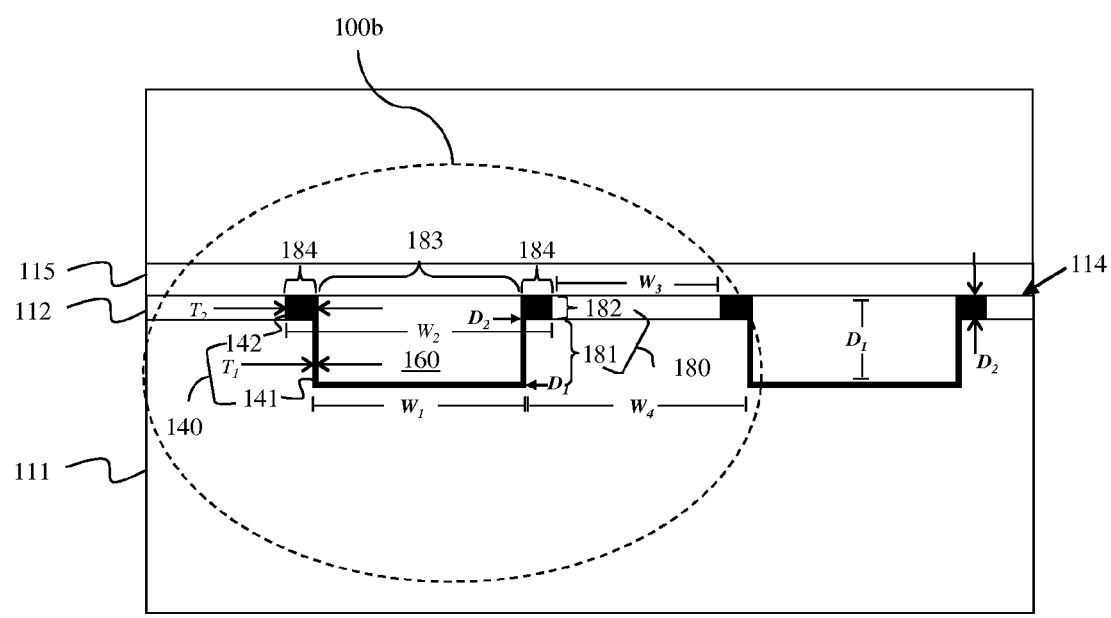
FIG. 2 is a cross-section drawing illustrating another embodiment of a wiring structure.

Specifically, referring to FIGS. 1 and 2, disclosed herein are embodiments of a back end of the line (BEOL) wiring structure 100a, 100b, respectively. In both embodiments, the wiring structure 100a, 100b can comprise at least one dielectric layer.

For example, as shown in FIG. 1, the wiring structure 100a can comprise a dielectric layer 110. This dielectric layer 110 can comprise, for example, a dielectric material, such as an organosilicate glass (SiCOH), a porous organosiliciate glass (pSiCOH) or a SiLK™ resin, having a relatively low dielectric constant k (e.g., k<3.9).

Alternatively, as shown in FIG. 2, the wiring structure 100b can comprise a stack of dielectric layers (e.g., a first dielectric layer 111 and a second dielectric layer 112 on the first dielectric layer). In this case, the first dielectric layer 111 can comprise, for example, a dielectric material, such as an organosilicate glass (SiCOH), a porous organosiliciate glass (pSiCOH) or a SiLK™ resin, having a relatively low dielectric constant k (e.g., k<3.9). The second dielectric layer 112 can comprise a different dielectric material that can be selectively etched over the first dielectric material (e.g., silicon dioxide ($SiO_2$)).

Wires can be embedded in the dielectric layer(s) and connecting vias can connect such wires to other wiring levels and/or to devices in the substrate below (not shown). Each wire can comprise an opening 180 (i.e., a wiring trench) that extends vertically into the dielectric layer(s) to a predetermined depth (e.g., 20-50 nm) as measured from the top surface 114 of the dielectric layer(s).

A conductive diffusion barrier layer 140 can line the opening 180 (i.e., can cover the sidewalls and bottom surface of the opening 180). This conductive diffusion barrier layer 140 can comprise any suitable conductive material that exhibits high atomic diffusion resistance (i.e., a conductive diffusion barrier material that exhibits low atomic diffusivity). The conductive diffusion barrier layer 140 can comprise, for example, a titanium nitride (TiN) layer, a titanium (Ti) layer, a cobalt (Co) layer, a chromium (Cr) layer, a ruthenium (Ru) layer, a tantalum (Ta) layer, a tantalum nitride (TaN) layer, an indium oxide ($In_2O_3$) layer, a tungsten (W) layer, a tungsten nitride (WN) layer, etc.

A wiring metal layer 160 can be positioned on the diffusion barrier layer 140 so as to fill the opening 180. The wiring metal layer 160 can comprise, for example, a copper (Cu) layer, an aluminum (Al) layer or any other suitable metal or metal alloy wiring layer.

An insulating cap layer 115 can be positioned on the top surface 114 of the dielectric layer(s) (i.e., on the top surface of dielectric layer 110 of FIG. 1 or on the top surface of dielectric layer 112 of FIG. 2) and can extend laterally over the opening 180 (i.e., over the diffusion barrier layer 140 lining the opening 180 and over the metal layer 160 filling the opening 180). This insulating cap layer 115 can comprise a different dielectric material than that used for the dielectric layer 110 of FIG. 1 or the dielectric layer 111 of FIG. 2. Specifically, this insulating cap layer 115 can comprise any suitable insulating material that exhibits low atomic diffusivity (e.g., silicon nitride (SiN), silicon oxynitride (SiON), silicon carbide (SiC), silicon carbon oxide (SiCO), etc.).

Additionally, in each of the embodiments of the wiring structure 100a, 100b, the diffusion barrier layer 140 can have a first thickness $T_1$ in a lower portion 181 of the opening 180 (e.g., in a lower 75-98% of the opening 180) and a second thickness $T_2$, which is greater than the first thickness $T_1$, in an upper portion 182 of the opening 180 (e.g., in an upper 2-25% of the opening 180). In exemplary embodiments, the second thickness $T_2$ can, for example, be 1.25 to 10 times greater than the first thickness $T_1$. For example, the first thickness $T_1$ can be approximately 1-3 nm and the second thickness $T_2$ can be approximately 4-5 nm. For example, the first thickness $T_1$ can be approximately 1.5 nm and the second thickness $T_2$ can be approximately 5 nm.

In exemplary embodiments, the lower portion 181 of the opening 180 (e.g., the lower 75-98% of the opening 180) can have a first width $W_1$ and first depth $D_1$ and the upper portion 182 of the opening 180 (e.g., the upper 2-25% of the opening 180) can have a second width $W_2$, which is greater than the first width $W_1$, and a second depth $D2_1$, which is shallower than the first depth $D_1$. Thus, the upper portion 182 of the opening 180 can have a center section 183 aligned above the lower portion 181 of the opening 180 and edge sections 184 that extend laterally beyond the lower portion 181 of the opening 180. In this case, the different first and second thicknesses $T_1$ and $T_2$ are achieved by lining the lower portion 181 of the opening 180 and further filling the edge sections 184 of the upper portion 182 of the opening 180, respectively. Thus, the differences between the two thicknesses $T_1$ and $T_2$ will vary as a function of the dimensions of the opening 180 and, particularly, the dimensions (width and depth) of the lower and upper portions 181-182 of the opening 180 as well as the technique used to deposit the diffusion barrier layer 140.

It should be noted that, depending upon the processing techniques used to form the wiring structure, as discussed in greater detail with regard to the method embodiments below, the lower and upper portions 181-182 of the opening 180 can be etched into the same dielectric layer 110, as shown in FIG. 1, or, alternatively, the lower and upper portions 181-182 of the opening 180 can be etched into two different dielectric layers 111-112, as shown in FIG. 2.

Figure 3:
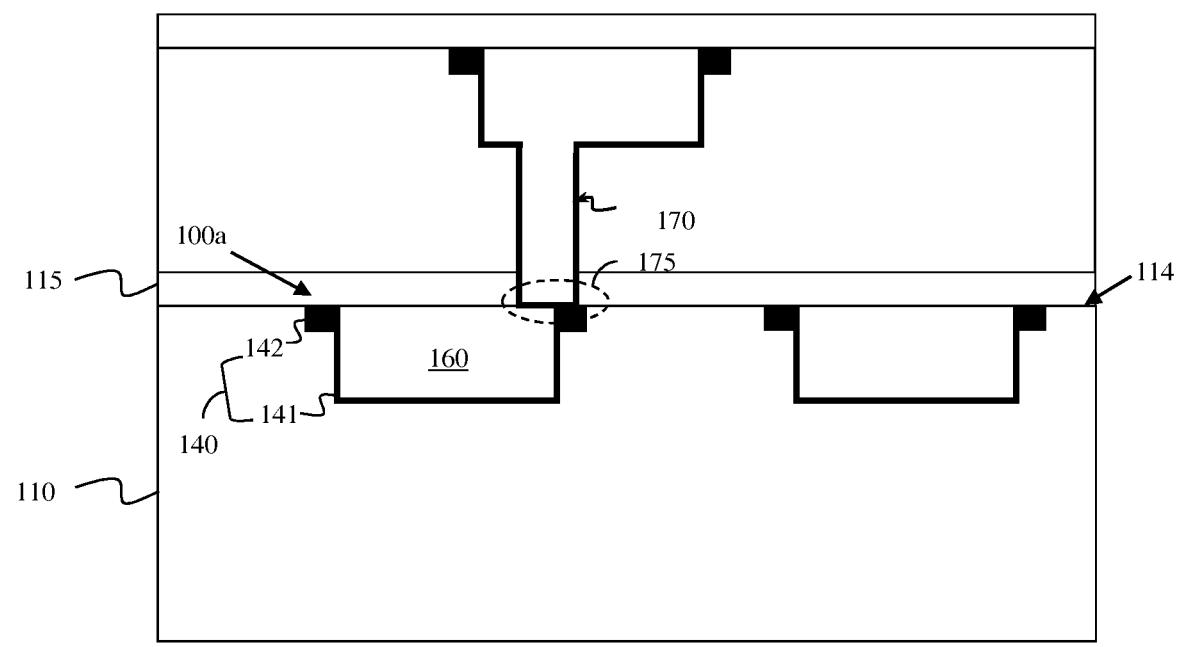
FIG. 3 is a cross-section drawing illustrating the wiring structure of FIG. 1 contacted by a via.

The above-described wiring structure 100a, 100b, having a wiring trench 180 with a relatively wide upper portion 182 lined with a relatively thick amount of diffusion barrier material 142 and a relatively narrow lower portion 181 lined with a relatively thin amount of diffusion barrier 141, allows a wire width to dielectric space width ratio that is optimal for low TDDB (e.g., 60:40) to be achieved (see the ratio of width $W_2$ to width $W_3$) in the area of the wiring structure 100a, 100b most susceptible to failure due to metal ion diffusion induced TDDB (i.e., at the junction between the opening 180 and the dielectric materials above and to the side of the opening 180). This wiring structure 100a, 100b further allows a different wire width to dielectric space width ratio (e.g., 50:50) to be maintained in the rest of the wiring structure 100a, 100b in order to balance out other competing factors (e.g., EM, shorts and parasitic capacitance) (see the ratio width $W_1$ to width $W_4$). Additionally, the relatively thick amount of diffusion barrier material 142 in the upper portion 182 further reduces the line-to-line fringe field by widening the effective line width to further improve (i.e., decrease) TDDB, whereas the relatively thin amount of diffusion barrier material 141 in the lower portion 181 of the opening 180 avoids EM failure and an increase in wiring structure resistivity (e.g., due to a reduction in metal 160 volume and/or an increase in the proportional amount of diffusion barrier material 140 to metal 160 material in the wiring structure). Thus, the wiring structure 100a, 100b allows for technology scaling without a significant corresponding increase in EM, TDDB or wiring structure resistivity. It should be noted that, as illustrated in FIG. 3, increasing the wire width to dielectric space width ratio at the top of the wiring structure 100a or 100b provides the additional advantages of increasing the available surface area for a connecting via 170 above to land on and enhancing liner to liner 175 contact with such a via 170 to further improve (i.e., decrease) EM.

Also disclosed herein are embodiments of a method for forming a wiring structure, such as the wiring structure 100a of FIG. 1 or 100b of FIG. 2. These embodiments can comprise first providing a substrate having various devices formed thereon (not shown). Next, wiring levels are formed on the substrate above the devices such that each wiring level comprises wiring structures (i.e., metal wires) 100a, 100b and also vias, which connect the wiring structures 100a, 100b to other wiring levels and/or to devices in the substrate below.

Figure 4:
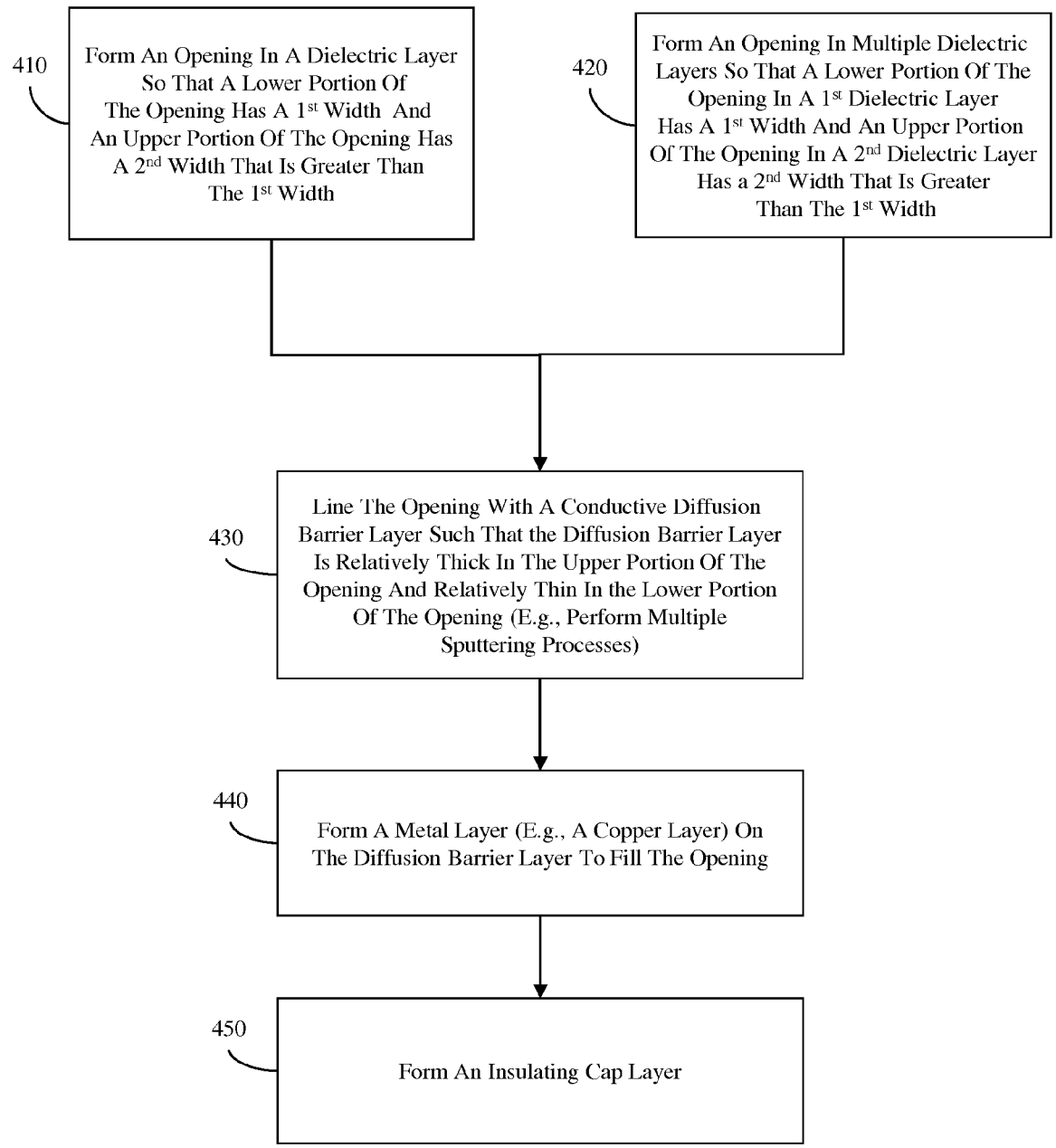
FIG. 4 is a flow diagram illustrating method embodiments for forming a wiring structure.
Figure 5:
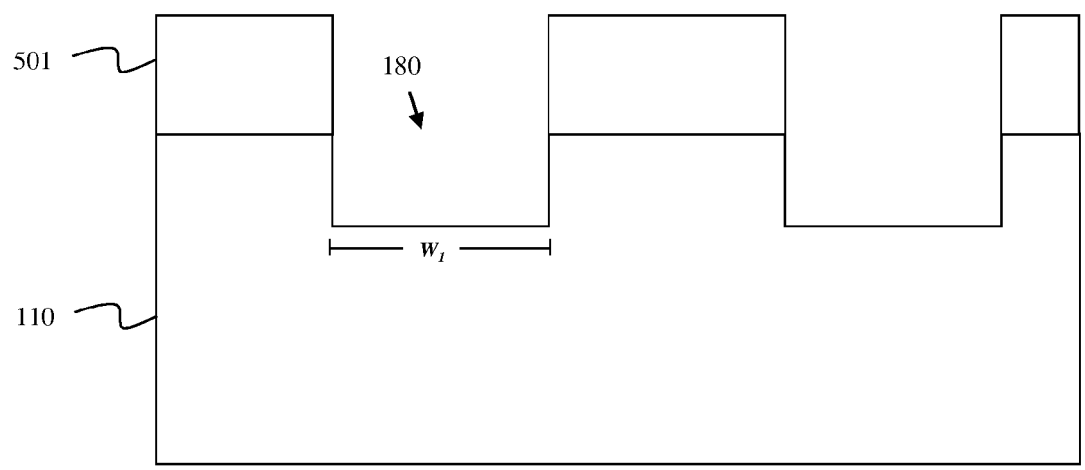
FIG. 5 is a cross-section drawing illustrating a partially completed wiring structure formed according to the method of FIG. 4.
Figure 6:
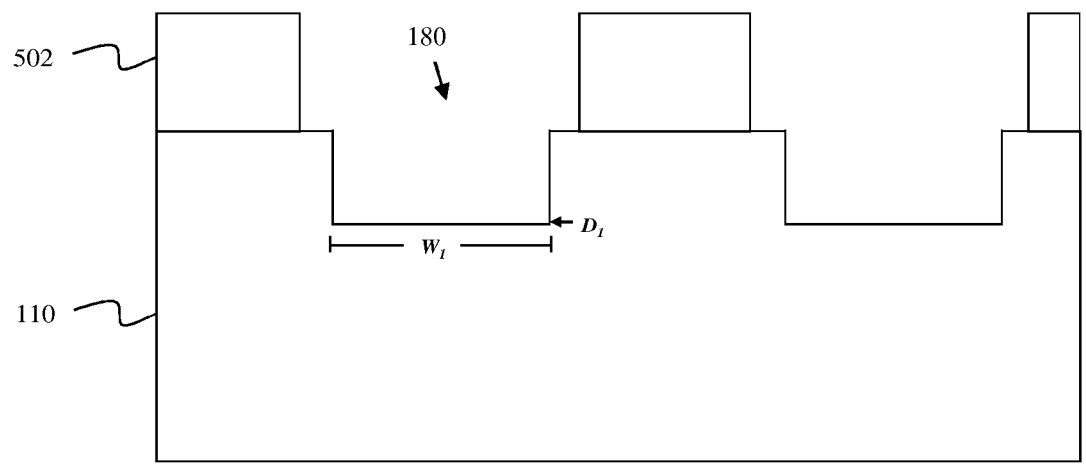
FIG. 6 is a cross-section drawing illustrating a partially completed wiring structure formed according to the method of FIG. 4.
Figure 7:
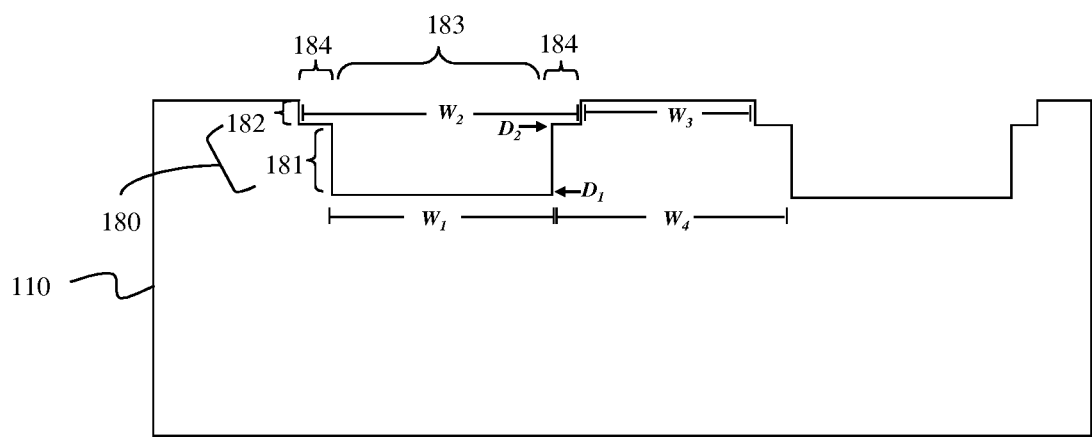
FIG. 7 is a cross-section drawing illustrating a partially completed wiring structure formed according to the method of FIG. 4.

Referring to FIG. 4, in order to form the wiring structure 100a of FIG. 1, an opening 180 (i.e., a wiring trench) can be formed in a dielectric layer 110 on a substrate such that the opening 180 has a lower portion 181 with a first width $W_1$ and a first depth $D_1$ and an upper portion 182 with a second width $W_2$ that is greater than the first width $W_1$ and a second depth $D_2$ that is shallower than the first depth $D_1$ (410, see FIGS. 5-7). Such an opening can, for example, be formed by first forming a photoresist layer on the dielectric layer 110 and lithographically patterning the photoresist layer to form a mask 501 that exposes a portion of the dielectric layer 110. Next, using the mask 501, an anisotropic etch process can be performed to form an initial opening that extends vertically into the dielectric layer 110 to the first depth $D_1$ and that has the first width $W_1$ (see FIG. 5). Then, the vertical sidewalls of the photoresist layer 501 can be pulled back to form a new mask 502 that exposes a greater portion of the dielectric layer 110 (see FIG. 6). Alternatively, the mask 501 can be removed and another photoresist layer can be lithographically patterned to form a new mask 502 that exposes a greater portion of the dielectric layer 110 (see FIG. 6). Next, using the mask 502, another anisotropic etch process can be performed stopping a second depth $D_2$ which is shallower than the first depth $D_1$ in order to expand the width of the upper portion 182 only of the opening 180 to the second width $W_2$. Then, the mask 502 can be removed (see FIG. 7). As a result, the upper portion 182 of the opening 180 will have a center section 183 and edge sections 184 adjacent to the center section 183. The center section 183 can be aligned above the lower portion 181 of the opening 180 and the edge sections 184 can extend laterally beyond the lower portion 181 of the opening 180 forming a rim. It should be noted that the first depth $D_1$ and second depth $D_2$ can be predetermined so that the upper portion 182 of the opening 180 having the second width $W_2$ comprises the upper 2-25% of the opening 180 and the lower portion 181 of the opening 180 having the first width $W_1$ comprises the lower 75-98% of the opening 180.

Figure 8:
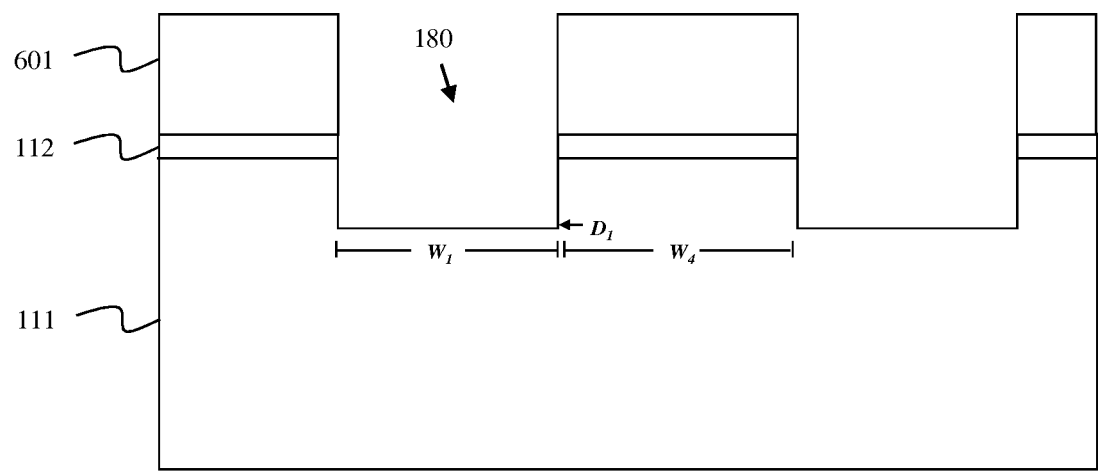
FIG. 8 is a cross-section drawing illustrating a partially completed wiring structure formed according to the method of FIG. 4.
Figure 9:
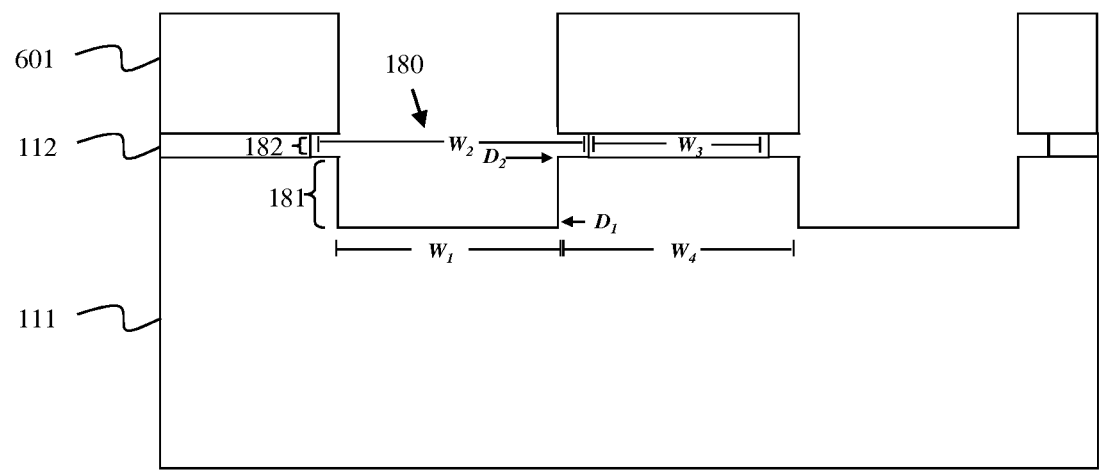
FIG. 9 is a cross-section drawing illustrating a partially completed wiring structure formed according to the method of FIG. 4.
Figure 10:
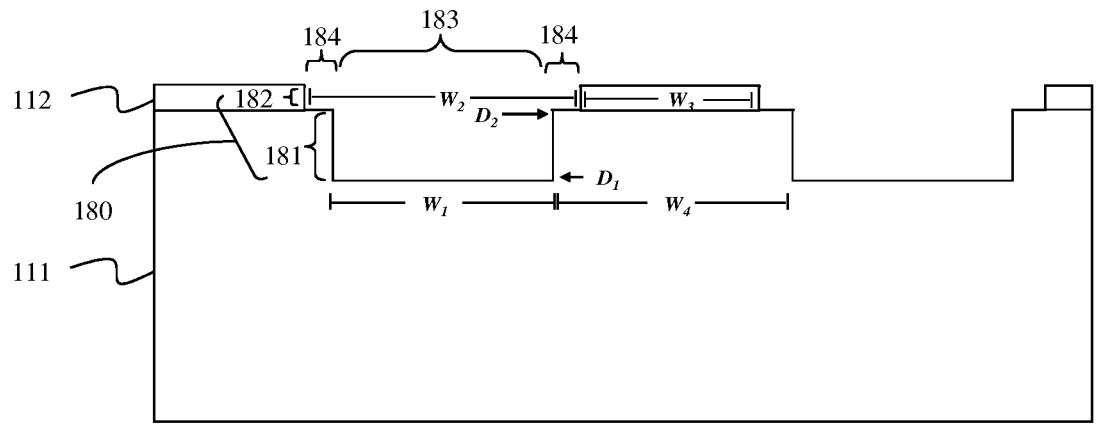
FIG. 10 is a cross-section drawing illustrating a partially completed wiring structure formed according to the method of FIG. 4.

Alternatively, in order to form the wiring structure 100b of FIG. 2, an opening 180 (i.e., a wiring trench) can be formed in multiple dielectric layers 111-112 on a substrate such that the opening 180 has a lower portion 181 in a first dielectric layer 111 and having a first width $W_1$ and a first depth $D_1$ and an upper portion 182 in a second dielectric layer 112 and having a second width $W_2$ that is greater than the first width $W_1$ and a second depth $D_2$ that is shallower than the first depth $D_1$ (420, see FIGS. 8-10). The dielectric layers 111-112 can comprise different dielectric materials. For example, the first dielectric layer 111 can comprise, for example, a dielectric material, such as an organosilicate glass (SiCOH), a porous organosiliciate glass (pSiCOH) or a SiLK™ resin, having a relatively low dielectric constant k (e.g., k<3.9). The second dielectric layer 112 can comprise a different dielectric material that can be selectively etched over the first dielectric material (e.g., silicon dioxide ($SiO_2$)). The opening 180 can, for example, be formed by first forming a photoresist layer on the second dielectric layer 112 and lithographically patterning the photoresist layer to form a mask 601 that exposes a portion of the second dielectric layer 112. Next, using the mask 601, an anisotropic etch process can be performed to form an initial opening that has the first width $W_1$ and that extends vertically through the second dielectric layer 112 and into the first dielectric layer 111 to the first depth $D_1$ (see FIG. 8). Then, the exposed vertical surfaces of the second dielectric layer 112 within the initial opening can be pulled back (e.g., using a selective isotropic etch process) such that the upper portion of the opening has the second width $W_2$ that is greater than the first width $W_1$ and the second depth $D_2$ which is equal to the thickness of the second dielectric layer 112 (see FIG. 9). The mask 601 can then be removed (see FIG.10). As a result, the upper portion 182 of the opening 180 will have a center section 183 aligned above the lower portion 181 of the opening 180 and edge sections 184 that extend vertically only through the second dielectric layer 112 (i.e., to the second depth $D_2$ which is shallower than the first depth $D_1$). Thus, the edge sections 184 of the upper portion 182 of the opening 180 form a rim that extends laterally beyond the lower portion 181 of the opening 180.

It should be noted that, in either process 410 or process 420, the second etch process, which widens the upper portion 182 of the opening 180, can also be used to improve line edge roughness and, thereby improve wire to wire spacing uniformity.

It should be understood that the process 410 and the alternative process 420 described above for forming the wiring trench 180 can each be performed in conjunction with the formation of one or more connecting via holes (not shown) that extend vertically from the bottom surface of the wiring trench 180 to a device or metal level below. That is, although only a single damascene process is described in detail herein, a dual damascene process can alternatively be performed wherein in addition to a wiring trench 180, having a lower portion 181 with a first width $W_1$ and an upper portion 182 with a second width $W_2$ that is greater than the first width, one or more connecting via holes from that wiring trench 180 to a device or a metal level below can be formed.

Once formed at process 410 or 420, the opening 180 can be lined with a conductive diffusion barrier layer 140 (430). For purposes of illustration, the remaining process steps are described and illustrated with respect to the formation of the wiring structure 100a of FIG. 1. However, it should be understood that these same process steps can similarly be performed with respect to the formation of the wiring structure 100b of FIG. 2.

Figure 11:
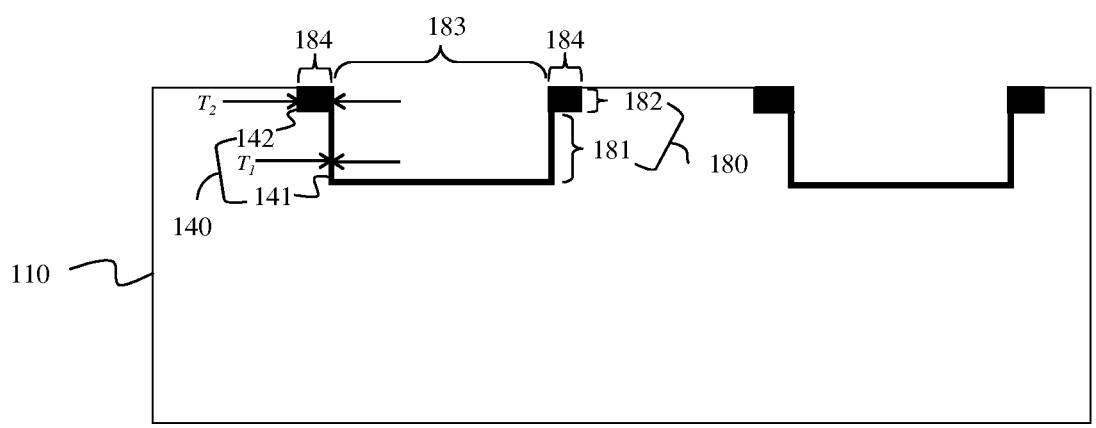
FIG. 11 is a cross-section drawing illustrating a partially completed wiring structure formed according to the method of FIG. 4.

Specifically, the opening 180 can be lined with a conductive diffusion barrier layer 140 such that it has a first thickness $T_1$ in the lower portion 181 of the opening 180 (e.g., in the lower 75-98% of the opening 180) and a second thickness $T_2$, which is greater than the first thickness $T_1$, in the upper portion 182 of the opening 180 (e.g., in the upper 2-25% of the opening 180) (see FIG. 11). This diffusion barrier layer 140 can comprise any suitable conductive material that exhibits high atomic diffusion resistance (i.e., a conductive diffusion barrier material that exhibits low atomic diffusivity). For example, the diffusion barrier layer 140 can comprise, for example, a titanium nitride (TiN) layer, a titanium (Ti) layer, a cobalt (Co) layer, a chromium (Cr) layer, a ruthenium (Ru) layer, a tantalum (Ta) layer, a tantalum nitride (TaN) layer, an indium oxide ($In_2O_3$) layer, a tungsten (W) layer, a tungsten nitride (WN) layer, etc. One technique for achieving the different thicknesses $T_1$ and $T_2$ is to perform multiple sputtering processes. For example, a first sputtering process can be performed, which will line the lower portion 181 of the opening 180 and further fill edge sections 184 of the upper portion 182 of the opening 180. Following the first sputtering process, the diffusion barrier layer 140 will likely be relatively thick on all horizontal surfaces in the opening 180, including both the edge sections 184 and the bottom surface. In order to reduce the thickness of the diffusion barrier layer 140 on the bottom surface of the opening 180 so as to ensure that within the lower portion 181 of the opening 180 the diffusion barrier layer 140 has an approximately uniform thickness $T_1$ on both the vertical and horizontal surfaces, a second sputtering process can be performed.

Those skilled in the art will recognize that the differences between the two thicknesses $T_1$ and $T_2$ will vary as a function of the dimensions of the opening 180 formed at process 410 or 420 and, particularly, the dimensions of the lower and upper portions 181-182 of the opening 180 as well as the techniques used to form the diffusion barrier layer 140 at process 430. Thus, depending upon the dimensions of the opening 180 formed at process 410 or 420 and the techniques used to form the diffusion barrier layer 140 at process 430, the diffusion barrier layer 140 can be formed so that the second thickness $T_2$ is, for example, 1.25 to 10 times greater the first thickness $T_1$. For example, the diffusion barrier layer 140 can be formed such that the first thickness $T_1$ is approximately 1-3 nm and the second thickness $T_2$ is approximately 4-5 nm. For example, the diffusion barrier layer 140 can be formed such that the first thickness $T_1$ is approximately 1.5 nm and the second thickness $T_2$ is approximately 5 nm.

Figure 12:
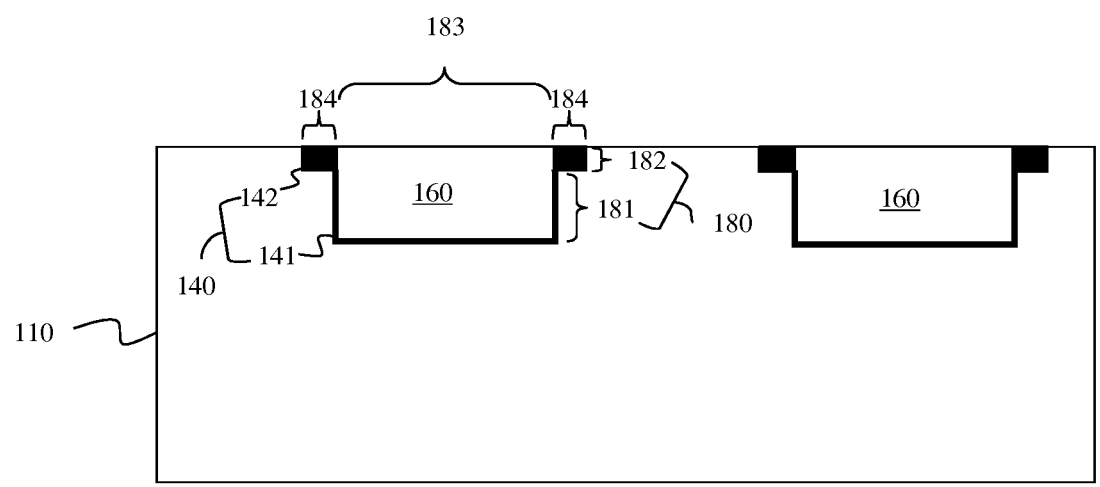
FIG. 12 is a cross-section drawing illustrating a partially completed wiring structure formed according to the method of FIG. 4.

After the opening 180 is lined with the diffusion barrier layer 140, a metal layer 160 (e.g., a copper (Cu) layer, an aluminum (Al) layer or any other suitable wiring metal layer) can be formed (e.g., using a conventional electroplating process or other suitable deposition process) on the diffusion barrier layer 140 to fill the opening 180 (440, see FIG. 12). A chemical mechanical polishing (CMP) step can be performed following metal layer 160 deposition. Finally, an insulating cap layer 115 can be formed (e.g., deposited by physical vapor deposition (PVD), chemical vapor deposition (CVD), or other suitable deposition technique) on the top surface of the dielectric layer 110 such that it extends laterally over the opening 180 (i.e., over the diffusion barrier layer 140 and the metal layer 160 within the opening 180) (450, see FIGS. 1 and 2). This insulating cap layer 115 can comprise any suitable insulating material that exhibits low atomic diffusivity (e.g., silicon nitride (SiN), silicon oxynitride (SiON), silicon carbide (SiC), silicon carbon oxide (SiCO), etc.).

The above-described method of forming a wiring structure 100a, 100b, having a wiring trench 180 with a relatively wide upper portion 182 lined with a relatively thick amount of diffusion barrier material 142 and a relatively narrow lower portion 181 lined with a relatively thin amount of diffusion barrier 141, allows a wire width to dielectric space width ratio that is optimal specifically for low TDDB (e.g., 60:40) to be achieved (see the ratio of width $W_2$ to width $W_3$) in the area of the wiring structure 100a, 100b most susceptible to failure due to metal ion diffusion induced TDDB (i.e., at the junction between the opening 180 and the dielectric materials above and to the side of the opening 180). This method further allows a different wire width to dielectric space width ratio (e.g., 50:50) to be maintained in the rest of the wiring structure 100a, 100b in order to reduce EM failure and to balance out other competing factors (e.g., shorts and parasitic capacitance) (see the ratio width $W_1$ to width $W_4$). Additionally, the relatively thick amount of diffusion barrier material 142 in the upper portion 182 further reduces the line-to-line fringe field by widening the effective line width to further improve (i.e., decrease) TDDB, whereas the relatively thin amount of diffusion barrier material 141 in the lower portion 181 of the opening 180 avoids an increase in wiring structure resistivity (e.g., due to a reduction in metal 160 volume and/or an increase in the proportional amount of diffusion barrier material 140 to metal 160 material in the wiring structure). Thus, the method of forming a wiring structure 100a, 100b allows for technology scaling without a significant corresponding increase in EM, TDDB or wiring structure resistivity. It should be noted that, as illustrated in FIG. 3, increasing the wire width to dielectric space width ratio at the top of the wiring structure 100a or 100b provides the additional advantages of increasing the available surface area for a connecting via 170 above to land on and enhancing liner to liner contact with such a via 170 to further improve (i.e., decrease) EM.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should be understood that the terminology used herein is for the purpose of describing the disclosed embodiments only and is not intended to be limiting. As used herein, the singular forms "a", "an" and "the" are intended to include the plural forms as well, unless the context clearly indicates otherwise. It will be further understood that the terms "comprises", "comprising", "includes" and/or "including", when used in this specification, specify the presence of stated features, integers, steps, operations, elements, and/or components, but do not preclude the presence or addition of one or more other features, integers, steps, operations, elements, components, and/or groups thereof. It should further be understood that the corresponding structures, materials, acts, and equivalents of all means or step plus function elements in the claims below are intended to include any structure, material, or act for performing the function in combination with other claimed elements as specifically claimed.

It should further be understood that the disclosed embodiments have been presented for purposes of illustration and description, but are not intended to be exhaustive or limiting in the form disclosed. Many modifications and variations to the disclosed embodiments will be apparent to those of ordinary skill in the art without departing from the scope and spirit thereof. The embodiments were chosen and described in order to best explain the disclosed principles and the practical application of those principles, and to enable others of ordinary skill in the art to understand the various embodiments with various modifications as are suited to the particular use contemplated. Finally, it should be understood that the corresponding structures, materials, acts, and equivalents of all means or step plus function elements in the claims below are intended to include any structure, material, or act for performing the function in combination with other claimed elements as specifically claimed.

Therefore, disclosed above are embodiments of a back end of the line (BEOL) wiring structure and method of forming the wiring structure with a conductive diffusion barrier layer that has a relatively thick upper portion and relatively thin lower portion. The thicker upper portion of the diffusion barrier layer is located at the junction between the wiring structure and the dielectric materials above and to the side (i.e., at the triple junction). By making the diffusion barrier layer thicker at the triple junction, which is the area most susceptible to failures due to metal ion diffusion induced time dependent dielectric breakdown (TDDB), metal ion diffusion and, thereby TDDB can be minimized. Additionally, the thicker upper portion of the diffusion barrier layer (1) allows a wire width to dielectric space width ratio that is optimal for low TDDB (e.g., 60:40) to be achieved at the top of the wiring structure and (2) provides a greater surface area for via landing. Whereas, the thinner lower portion of the diffusion barrier layer allows a different wire width to dielectric space width ratio (e.g., 50:50) to be maintained in the rest of the wiring structure in order to reduce EM failure and to balance out other competing factors (e.g., EM, shorts and parasitic capacitance). Additionally, the thinner lower portion of the diffusion barrier layer (1) allows a larger cross-section of wire to reduce current density and, thereby reduce electromigration (EM) and (2) avoids an increase in wiring structure resistivity (e.g., due to a reduction in metal volume and/or an increase in the proportional amount of diffusion barrier material in the wiring structure). Thus, the wiring structure allows for technology scaling without a significant corresponding increase in EM in the wiring structure, in TDDB between adjacent wiring structures and induced by metal ion diffusion, or in wiring structure resistivity.

What is claimed is:

1. A wiring structure comprising:
a dielectric layer;
an opening in said dielectric layer, said opening having vertical sidewalls, a lower portion, and an upper portion aligned above and wider than said lower portion such that said upper portion has a horizontal surface perpendicular to said vertical sidewalls;
a diffusion barrier layer lining said opening, said diffusion barrier layer having a first thickness in said lower portion of said opening and a second thickness in said upper portion of said opening, said second thickness being greater than said first thickness, wherein said diffusion barrier layer completely filling a space between said horizontal surface and said insulating cap layer;
a metal layer on said diffusion barrier layer and filling said opening; and
an insulating cap layer on said dielectric layer, said diffusion barrier layer and said metal layer.

2. The structure of claim 1, said second thickness being 1.25 to 10 times greater than said first thickness.

3. The structure of claim 1, said first thickness being approximately 1-3 nm and said second thickness being approximately 4-5 nm.

4. The structure of claim 1, said first thickness being approximately 1.5 nm and said second thickness being approximately 5 nm.

5. The structure of claim 1, said upper portion having a first wire width to dielectric space width ratio of approximately 60:40 and said lower portion having second wire width to dielectric space width ratio of approximately 50:50.

6. A wiring structure comprising:
a first dielectric layer;
a second dielectric layer on said first dielectric layer;
an opening extending through said second dielectric layer into said first dielectric layer, said opening having vertical sidewalls, a lower portion in said first dielectric layer and having a first width and an upper portion in said second dielectric layer aligned above said lower portion and having a second width that is greater than said first width such that said upper portion has a horizontal surface perpendicular to said vertical sidewalls, said horizontal surface comprising a portion of a top surface of said first dielectric layer;
a diffusion barrier layer lining said opening, said diffusion barrier layer having a first thickness in said lower portion of said opening within said first dielectric layer and a second thickness in said upper portion of said opening within said second dielectric layer, said second thickness being greater than said first thickness;
a metal layer on said diffusion barrier layer and filling said opening; and
an insulating cap layer on said second dielectric layer, said diffusion barrier layer and said metal layer.

7. The structure of claim 6, said second thickness being 1.25 to 10 times greater than said first thickness.

8. The structure of claim 6, said first thickness being approximately 1-3 nm and said second thickness being approximately 4-5 nm.

9. The structure of claim 6, said diffusion barrier layer filling a space between said horizontal surface and said insulating cap layer.

10. The structure of claim 6, said first dielectric layer and said second dielectric layer comprising different dielectric materials.

11. The structure of claim 6, said upper portion having a first wire width to dielectric space width ratio of approximately 60:40 and said lower portion having second wire width to dielectric space width ratio of approximately 50:50.

12. A method of forming a wiring structure, said method comprising:
forming an opening in a dielectric layer such that said opening has vertical sidewalls, a lower portion, and an upper portion, said upper portion being aligned above and wider than said lower portion such that said upper portion has a horizontal surface perpendicular to said vertical sidewalls;
lining said opening with a diffusion barrier layer such that said diffusion barrier layer has a first thickness in said lower portion of said opening and a second thickness in said upper portion of said opening, said second thickness being greater than said first thickness, said lining of said opening being performed such that, after said forming of said insulating cap layer, said diffusion barrier layer completely fills a space between said horizontal surface and said insulating cap layer;
forming a metal layer on said diffusion barrier layer to fill said opening; and
forming an insulating cap layer on a top surface of said dielectric layer and further extending laterally over said diffusion barrier layer and said metal layer in said opening.

13. The method of claim 12, said lining of said opening being performed such that said first thickness is approximately 1.5 nm and said second thickness is approximately 5 nm.

14. The method of claim 12, said lining of said opening comprising performing multiple sputtering processes to ensure that said diffusion barrier layer has an approximately uniform thickness on vertical and horizontal surfaces of said lower portion.

15. The method of claim 12, said lining of said opening comprising lining said opening such that said second thickness is 1.25 to 10 times greater than said first thickness.

16. The method of claim 13, said lining of said opening comprising lining said opening such that said first thickness is approximately 1-3 nm and said second thickness is approximately 4-5 nm.

17. A method of forming a wiring structure, said method comprising:
providing a substrate comprising a first dielectric layer and a second dielectric layer on said first dielectric layer, said second dielectric layer having a top surface;
forming an opening extending from said top surface through said second dielectric layer into said first dielectric layer, said opening having vertical sidewalls, a lower portion with a first width in said first dielectric layer, and an upper portion with a second width that is greater than said first width in said second dielectric layer, said upper portion being aligned above said lower portion such that said upper portion has a horizontal surface perpendicular to said vertical sidewalls, said horizontal surface comprising a portion of a top surface of said first dielectric layer;
lining said opening with a diffusion barrier layer such that said diffusion barrier layer has a first thickness in said lower portion of said opening within said first dielectric layer and a second thickness in said upper portion of said opening within said second dielectric layer, said second thickness being greater than said first thickness;
forming a metal layer on said diffusion barrier layer so as to fill said opening; and
forming an insulating cap layer on said second dielectric layer, said diffusion barrier layer and said metal layer.

18. The method of claim 17, said forming of said opening comprising: performing a first etch process to etch an initial opening through said second dielectric layer and into said first dielectric layer, said initial opening having said first width; and performing a second etch process to etch back vertical surfaces of said second dielectric layer to achieve said second width and expose said portion of said top surface of said first dielectric layer.

19. The method of claim 17, said lining of said opening being performed such that, after said forming of said insulating cap layer, said diffusion barrier layer fills a space between said horizontal surface and said insulating cap layer.

20. The method of claim 17, said lining of said opening comprising performing multiple sputtering processes to ensure that said diffusion barrier layer has an approximately uniform thickness on vertical and horizontal surfaces of said lower portion.

21. The method of claim 17, said lining of said opening comprising lining said opening such that said second thickness is 1.25 to 10 times greater than said first thickness.

22. The method of claim 17, said lining of said opening comprising lining said opening so that said first thickness is approximately 1-3 nm and so that said second thickness is approximately 4-5 nm.

23. The method of claim 17, said first dielectric layer and said second dielectric layer comprising different dielectric materials.

* * * * *